(12) United States Patent
Park et al.

(10) Patent No.: US 12,332,319 B2
(45) Date of Patent: Jun. 17, 2025

(54) SYSTEM AND METHOD FOR MANAGING VEHICLE BATTERY

(71) Applicants: Hyundai Motor Company, Seoul (KR); Kia Corporation, Seoul (KR)

(72) Inventors: Hyun Jin Park, Hwaseong-si (KR); Woo Sung Kim, Hwaseong-si (KR); Kyung In Min, Hwaseong-si (KR); Do Sung Hwang, Hwaseong-si (KR); Ki Seung Baek, Hwaseong-si (KR); Dong Il Kim, Hwaseong-si (KR); Dae Gun Jin, Hwaseong-si (KR); Yoon Jun Lee, Hwaseong-si (KR); Bo Ram Yang, Hwaseong-si (KR); Ki Chul Hong, Hwaseong-si (KR); Ik Kyu Kim, Hwaseong-si (KR); Sung Il Lee, Hwaseong-si (KR); Jae Shin Yi, Hwaseong-si (KR); Young Woo Lee, Hwaseong-si (KR); Soo Yang Jin, Hwaseong-si (KR); Suk Hyung Kim, Hwaseong-si (KR); Hyun Soo Park, Hwaseong-si (KR)

(73) Assignees: HYUNDAI MOTOR COMPANY, Seoul (KR); KIA CORPORATION, Seoul (KR)

( * ) Notice: Subject to any disclaimer, the term of this patent is extended or adjusted under 35 U.S.C. 154(b) by 724 days.

(21) Appl. No.: 17/518,991

(22) Filed: Nov. 4, 2021

(65) Prior Publication Data

US 2022/0144128 A1    May 12, 2022

Related U.S. Application Data

(60) Provisional application No. 63/110,744, filed on Nov. 6, 2020.

(51) Int. Cl.
*G01R 31/389* (2019.01)
*B60L 3/00* (2019.01)
(Continued)

(52) U.S. Cl.
CPC .......... *G01R 31/389* (2019.01); *B60L 3/0046* (2013.01); *B60L 50/60* (2019.02);
(Continued)

(58) Field of Classification Search
None
See application file for complete search history.

(56) References Cited

U.S. PATENT DOCUMENTS

| 7,154,247 B2 | 12/2006 | Kikuchi et al. |
| 7,456,612 B2 | 11/2008 | Murakami |

(Continued)

FOREIGN PATENT DOCUMENTS

| CA | 2 851 503 A1 | 4/2013 |
| CN | 103229346 A | 7/2013 |

(Continued)

OTHER PUBLICATIONS

Machine translation CN110165316A (Year: 2025).*
(Continued)

*Primary Examiner* — Miriam Stagg
*Assistant Examiner* — M. T. Leonard
(74) *Attorney, Agent, or Firm* — Morgan, Lewis & Bockius LLP (57) ABSTRACT

A system for managing a vehicle battery that is chargeable/dischargeable and stores energy for driving a vehicle driving motor is disclosed. The system for managing a vehicle battery as disclosed includes a controller that receives a voltage of each of a plurality of battery cells in a vehicle battery, a temperature of the vehicle battery, and an insulation resistance of the vehicle battery, determines a reference
(Continued)

value based on a deviation between voltages of the plurality of battery cells and the temperature of the vehicle battery, and determines whether the vehicle battery is abnormal by comparing the determined reference value with the insulation resistance.

20 Claims, 6 Drawing Sheets

(51) Int. Cl.
| | |
|---|---|
| *B60L 50/60* | (2019.01) |
| *B60L 58/10* | (2019.01) |
| *B60L 58/12* | (2019.01) |
| *B60L 58/16* | (2019.01) |
| *B60L 58/21* | (2019.01) |
| *G01R 31/367* | (2019.01) |
| *G01R 31/3835* | (2019.01) |
| *G01R 31/3842* | (2019.01) |
| *G01R 31/392* | (2019.01) |
| *G05B 23/02* | (2006.01) |
| *G07C 5/00* | (2006.01) |
| *G07C 5/08* | (2006.01) |
| *H01M 10/42* | (2006.01) |
| *H01M 10/48* | (2006.01) |

(52) U.S. Cl.
CPC .............. *B60L 58/10* (2019.02); *B60L 58/12* (2019.02); *B60L 58/16* (2019.02); *B60L 58/21* (2019.02); *G01R 31/367* (2019.01); *G01R 31/3835* (2019.01); *G01R 31/3842* (2019.01); *G01R 31/392* (2019.01); *G07C 5/008* (2013.01); *G07C 5/0825* (2013.01); *H01M 10/425* (2013.01); *H01M 10/482* (2013.01); *H01M 10/486* (2013.01); *B60L 2240/545* (2013.01); *B60L 2240/547* (2013.01); *G05B 23/0218* (2013.01); *G05B 23/0256* (2013.01); *H01M 2010/4271* (2013.01); *H01M 2220/20* (2013.01)

(56) References Cited

U.S. PATENT DOCUMENTS

| | | | |
|---|---|---|---|
| 7,589,492 B2 | 9/2009 | Ooishi et al. | |
| 7,821,234 B2 | 10/2010 | Moriya | |
| 7,893,652 B2 | 2/2011 | Suzuki et al. | |
| 7,990,109 B2 | 8/2011 | White et al. | |
| 8,000,915 B2 | 8/2011 | Furukawa et al. | |
| 8,219,333 B2 | 7/2012 | Li | |
| 8,878,493 B2 | 11/2014 | Kobayashi et al. | |
| 9,461,320 B2 | 10/2016 | Ballantine et al. | |
| 9,465,084 B2 | 10/2016 | Park | |
| 9,577,458 B2 | 2/2017 | Kaita et al. | |
| 9,685,807 B2 | 6/2017 | Nakao et al. | |
| 9,720,047 B2 | 8/2017 | Joe | |
| 10,132,868 B2 | 11/2018 | Sun et al. | |
| 10,261,136 B2 | 4/2019 | Hosaka et al. | |
| 10,830,829 B2 | 11/2020 | Gelso et al. | |
| 11,316,352 B2 | 4/2022 | Hale | |
| 11,491,877 B2 | 11/2022 | Sato | |
| 11,691,518 B2 | 7/2023 | Holme | |
| 12,024,052 B2 | 7/2024 | Kim | |
| 2002/0121902 A1* | 9/2002 | Suzuki ................. | B60L 3/0069 324/509 |
| 2004/0178798 A1 | 9/2004 | Kikuchi et al. | |
| 2006/0186890 A1 | 8/2006 | Iwane et al. | |
| 2007/0052424 A1 | 3/2007 | Okumura | |
| 2008/0053715 A1 | 3/2008 | Suzuki et al. | |
| 2009/0271132 A1 | 10/2009 | Furukawa et al. | |
| 2010/0224157 A1 | 9/2010 | Mizuno | |
| 2011/0006731 A1 | 1/2011 | Wang et al. | |
| 2012/0019253 A1 | 1/2012 | Ziegler et al. | |
| 2012/0112703 A1 | 5/2012 | Xu et al. | |
| 2013/0141109 A1 | 6/2013 | Love et al. | |
| 2013/0342212 A1 | 12/2013 | Kawahira et al. | |
| 2014/0159738 A1 | 6/2014 | Jeong et al. | |
| 2014/0218042 A1 | 8/2014 | Koba et al. | |
| 2014/0333315 A1 | 11/2014 | Yamamoto | |
| 2015/0228990 A1 | 8/2015 | Ballantine et al. | |
| 2015/0288197 A1 | 10/2015 | Choi | |
| 2016/0069963 A1 | 3/2016 | Hebiguchi | |
| 2017/0018823 A1* | 1/2017 | Kwon ................. | H01M 10/663 |
| 2017/0160327 A1 | 6/2017 | Jung et al. | |
| 2017/0279164 A1* | 9/2017 | Herrema ............. | H01M 10/484 |
| 2018/0034111 A1* | 2/2018 | Hinterberger ....... | H01M 50/574 |
| 2018/0062210 A1* | 3/2018 | Kim ................. | H01M 10/484 |
| 2018/0106869 A1 | 4/2018 | Gelso et al. | |
| 2019/0146040 A1* | 5/2019 | Murakami ............ | B60L 3/0046 324/430 |
| 2019/0337403 A1* | 11/2019 | Tanaka .............. | H01M 8/04228 |
| 2020/0072909 A1 | 3/2020 | Soejima et al. | |
| 2020/0096572 A1 | 3/2020 | You et al. | |
| 2020/0158784 A1 | 5/2020 | Fabregas et al. | |
| 2020/0326378 A1 | 10/2020 | Oono et al. | |
| 2020/0391610 A1 | 12/2020 | Park et al. | |
| 2020/0412153 A1 | 12/2020 | Matsumura et al. | |
| 2021/0231743 A1 | 7/2021 | Christopherson | |
| 2021/0323442 A1* | 10/2021 | Wu ........................... | B60L 3/12 |
| 2022/0111759 A1 | 4/2022 | Ijaz | |
| 2022/0149630 A1 | 5/2022 | Burchardt | |

FOREIGN PATENT DOCUMENTS

| | | | | |
|---|---|---|---|---|
| CN | 203909253 U | | 10/2014 | |
| CN | 106772099 A | | 5/2017 | |
| CN | 109613432 A | | 4/2019 | |
| CN | 110165316 A | * | 8/2019 | ............ H01M 10/42 |
| DE | 10 2015 203 878 A1 | | 9/2016 | |
| DE | 10 2019 110 349 A1 | | 10/2020 | |
| EP | 0 438 477 B1 | | 9/1995 | |
| EP | 1 316 458 A1 | | 6/2003 | |
| EP | 1 846 776 A1 | | 10/2007 | |
| EP | 1 919 059 A2 | | 5/2008 | |
| EP | 2 403 105 A2 | | 1/2012 | |
| EP | 4 095 957 A1 | | 11/2022 | |
| FR | 3 029 299 A1 | | 6/2016 | |
| JP | 2002-008733 A | | 1/2002 | |
| JP | 2002-084666 A | | 3/2002 | |
| JP | 2004-328902 A | | 11/2004 | |
| JP | 2006-292565 A | | 10/2006 | |
| JP | 2007-085772 A | | 4/2007 | |
| JP | 2007-292666 A | | 11/2007 | |
| JP | 2007-333494 A | | 12/2007 | |
| JP | 2009-190690 A | | 8/2009 | |
| JP | 4919120 B2 | | 4/2012 | |
| JP | 2013-083522 A | | 5/2013 | |
| JP | 2014-134467 A | | 7/2014 | |
| JP | 2018-181430 A | | 11/2018 | |
| JP | 6566425 B2 | | 8/2019 | |
| KR | 10-20080074240 A | | 8/2008 | |
| KR | 10-2012-0016993 A | | 2/2012 | |
| KR | 10-2013-0061964 A | | 6/2013 | |
| KR | 10-2013-0075379 A | | 7/2013 | |
| KR | 10-2014-0075983 A | | 6/2014 | |
| KR | 10-2014-0093122 A | | 7/2014 | |
| KR | 10-2014-0122520 A | | 10/2014 | |
| KR | 10-2015-0052384 A | | 5/2015 | |
| KR | 10-1558696 B1 | | 10/2015 | |
| KR | 10-1755910 B1 | | 7/2017 | |
| KR | 10-2017-0109435 A | | 9/2017 | |
| KR | 10-1818515 B1 | | 1/2018 | |
| KR | 10-2018-0056091 A | | 5/2018 | |
| KR | 10-2018-0067140 A | | 6/2018 | |
| KR | 10-101942707 B1 | | 1/2019 | |
| KR | 10-101955537 B1 | | 3/2019 | |
| KR | 10-2017573 B1 | | 9/2019 | |
| KR | 10-2020-0022639 A | | 3/2020 | |
| KR | 10-2020-0038005 A | | 4/2020 | |
| KR | 10-2020-0143019 A | | 12/2020 | |
| KR | 10-2229019 B1 | | 3/2021 | |

(56) References Cited

FOREIGN PATENT DOCUMENTS

| KR | 10-2022-0006270 A | 1/2022 |
|---|---|---|
| KR | 10-2022-0012483 A | 2/2022 |
| KR | 10-2022-0060083 A | 5/2022 |
| TW | I404644 B | 8/2013 |
| WO | 2006/082425 A1 | 8/2006 |
| WO | 2015/123304 A1 | 8/2015 |
| WO | 2016/071801 A1 | 5/2016 |
| WO | 2016/147326 A1 | 9/2016 |
| WO | 2019/008367 A1 | 1/2019 |

OTHER PUBLICATIONS

Office Action issued on Feb. 27, 2024 in U.S. Appl. No. 17/518,986.
Koch et al. (2014), Electrochemical Impedance Spectroscopy for Online Battery Monitoring—Power Electronics Control, 16th European Conference on Power Electronics and Applications.
Christensen et al. (2013), Using on-board Electrochemical Impedance Spectroscopy in Battery Management Systems, EVS27 Barcelona, Spain.
Takeno et al. (2004), Quick testing of batteries in lithium-ion battery packs with impedance-measuring technology, Journal of Power Sources, 128: 67-75.
U.S.Office Action dated Jan. 3, 2023, issued in corresponding U.S. Appl. No. 17/518,986.
U.S.Final Office Action dated Jun. 26, 2023, issued in corresponding U.S. Appl. No. 17/518,986.
Office Action issued Jul. 19, 2024 in U.S. Appl. No. 17/520,013.
Office Action issued on Sep. 25, 2024 in U.S. Appl. No. 17/520,007.
Office Action issued on Jun. 17, 2024 in corresponding U.S. Appl. No. 17/520,065.
Notice of Allowance issued on Nov. 20, 2024 in regard to the U.S. Appl. No. 17/520,013.

* cited by examiner

SYSTEM AND METHOD FOR MANAGING VEHICLE BATTERY

CROSS-REFERENCE TO RELATED APPLICATION

This application is a non-provisional patent application of the provisional patent application No. 63/110,744 filed on Nov. 6, 2020, the disclosures of which are incorporated herein by reference in their entirety.

TECHNICAL FIELD

The present disclosure relates to a system and method for managing a vehicle battery, and more particularly, to a system and method for managing a vehicle battery that effectively monitors a state of a battery in a parking state of a vehicle after charging the battery of the vehicle, so that various problems occurring in the battery in the vehicle parking state can be prevented in advance.

BACKGROUND

In general, an eco-friendly vehicle driven using electric energy is a vehicle that generates power by driving a motor, which is an electric rotation mechanism, using the electric energy stored in a battery. The dynamic performance of such an eco-friendly vehicle is closely related to the performance of the battery, so efficient monitoring and management of the battery is essential.

In general, the battery of an eco-friendly vehicle is managed by a controller commonly referred to as a battery management system (BMS). The battery management system collects various information for battery management (battery voltage, battery current, battery temperature, etc.) from the battery and applies the collected information to various prestored algorithms to calculate various parameters for battery management.

A conventional vehicle battery management technique is mainly performed in a state in which power is supplied to the battery management system, that is, in a power-on (IG ON) state. That is, a main relay connected to the battery monitors the state of the battery in a state in which an electrical connection between the battery and other components of the vehicle (for example, a power module that converts power from the battery to provide it to a motor or a charger that generates power for charging the battery) is established.

As described above, in the conventional vehicle battery management technique, since information for battery management is collected in a state in which the battery and other components are electrically connected, there is a problem in that the collected information is affected by other components, thereby preventing accurate battery condition monitoring.

In particular, in recent years, fatal accidents such as a fire occurring in a battery in a parking state of a vehicle occur frequently, so a technique that can determine in advance whether a battery is abnormal in a parking state of a vehicle and warn it before an accident occurs is required in a relevant technical field.

The matters described as the background art above are only for improving the understanding of the background of the present disclosure, and should not be taken as acknowledging that they correspond to the prior art already known to those of ordinary skill in the art.

SUMMARY OF THE DISCLOSURE

Accordingly, a technical object of the present disclosure is to provide a system and method for managing a vehicle battery capable of predetermining whether a battery is abnormal even when the battery is in a no-load state after charging the battery in a vehicle and warning it.

In order to achieve the above object, the present disclosure provides a system for managing a vehicle battery that is chargeable/dischargeable and stores energy for driving a vehicle driving motor, including a controller that receives a voltage of each of a plurality of battery cells in a vehicle battery, a temperature of the vehicle battery, and an insulation resistance of the vehicle battery, determines a reference value based on a deviation between voltages of the plurality of battery cells and the temperature of the vehicle battery, and determines whether the vehicle battery is abnormal by comparing the determined reference value with the insulation resistance.

In an embodiment of the present disclosure, the controller may determine a difference between a maximum value and a minimum value among the voltages of the plurality of battery cells as the deviation.

In an embodiment of the present disclosure, the controller may determine that abnormality occurs in the vehicle battery when a magnitude of the received insulation resistance is smaller than the reference value.

In an embodiment of the present disclosure, the controller may decrease a magnitude of the reference value as the deviation increases.

In an embodiment of the present disclosure, the controller may decrease a magnitude of the reference value as the temperature increases.

In an embodiment of the present disclosure, the controller may determine whether the vehicle battery is abnormal at every preset period, and may determine that abnormality occurs in the vehicle battery when a decrease amount of the insulation resistance obtained by subtracting a magnitude of the insulation resistance currently received from a magnitude of the insulation resistance received immediately before according to the present period is greater than the reference value.

In an embodiment of the present disclosure, the controller may decrease a magnitude of the reference value as the deviation increases.

In an embodiment of the present disclosure, the controller may decrease the magnitude of the reference value as the temperature increases.

In an embodiment of the present disclosure, the system may further include a cluster or an audio video navigation (AVN) that displays occurrence of abnormality in the battery when the controller determines that the abnormality occurs in the battery.

In an embodiment of the present disclosure, the cluster or the AVN may include a communication module that wirelessly transmits the occurrence of abnormality in the battery to a vehicle management server or a wireless terminal of a driver of the vehicle.

In order to achieve the above object, the present disclosure provides a method for managing a vehicle battery that is chargeable/dischargeable and stores energy for driving a vehicle driving motor, comprising steps of receiving a voltage of each of a plurality of battery cells in a vehicle battery, a temperature of the vehicle battery, and an insulation resistance of the vehicle battery; determining a reference value based on a deviation between voltages of the plurality of battery cells and a temperature of the vehicle battery; and determining whether the vehicle battery is abnormal by comparing the determined reference value with the insulation resistance.

In an embodiment of the present disclosure, in the step of determining whether the vehicle battery is abnormal, it may be determined that abnormality occurs in the vehicle battery when a magnitude of the received insulation resistance is smaller than the reference value.

In an embodiment of the present disclosure, in the step of determining a reference value, a magnitude of the reference value may decrease as the deviation increases.

In an embodiment of the present disclosure, in the step of determining a reference value, a magnitude of the reference value may decrease as the temperature increases.

In an embodiment of the present disclosure, the step of receiving, the step of determining a reference value and the step of determining whether the vehicle battery is abnormal may be repeated every preset period, and in the step of determining whether the vehicle battery is abnormal, it may be determined that abnormality occurs in the vehicle battery when a decrease amount of the insulation resistance obtained by subtracting a magnitude of the insulation resistance currently received from a magnitude of the insulation resistance received immediately before according to the present period is greater than the reference value.

In an embodiment of the present disclosure, in the step of determining a reference value, the magnitude of the reference value may decrease as the deviation increases.

In an embodiment of the present disclosure, in the step of determining a reference value, the magnitude of the reference value may decrease as the temperature increases.

In an embodiment of the present disclosure, the method may further include the step of displaying occurrence of abnormality in the battery on a cluster or an audio video navigation (AVN) when in the step of determining whether the vehicle battery is abnormal, it is determined that the abnormality occurs in the battery.

In an embodiment of the present disclosure, the step of displaying may include a step of wirelessly transmitting the occurrence of abnormality in the battery to a vehicle management server or a wireless terminal of a driver of the vehicle.

According to the system and method for managing a vehicle battery, it may determine whether the battery is abnormal based on the insulation resistance of the vehicle battery.

In particular, the system and method for managing a vehicle battery may perform the insulation resistance abnormality determination more strictly by changing the reference value for determining the insulation resistance abnormality by using other parameters indicating signs of battery abnormality such as battery cell voltage deviation or battery temperature.

In addition, the system and method for managing a vehicle battery determine the battery insulation resistance abnormality based on the decrease amount of the battery insulation resistance, so that when the battery insulation breakdown is in progress in the parking state, the battery abnormality is quickly detected in advance and is warned. Thus, it is possible to prevent the occurrence of more serious problems such as battery fire.

The effects obtainable in the present disclosure are not limited to the above-mentioned effects, and other effects not mentioned will be clearly understood by those of ordinary skill in the art from the following description.

DETAILED DESCRIPTION OF THE DISCLOSURE

Hereinafter, a system and method for managing a vehicle battery according to an embodiment of various embodiments of the present disclosure will be described in detail with reference to the accompanying drawings.

Figure 1:
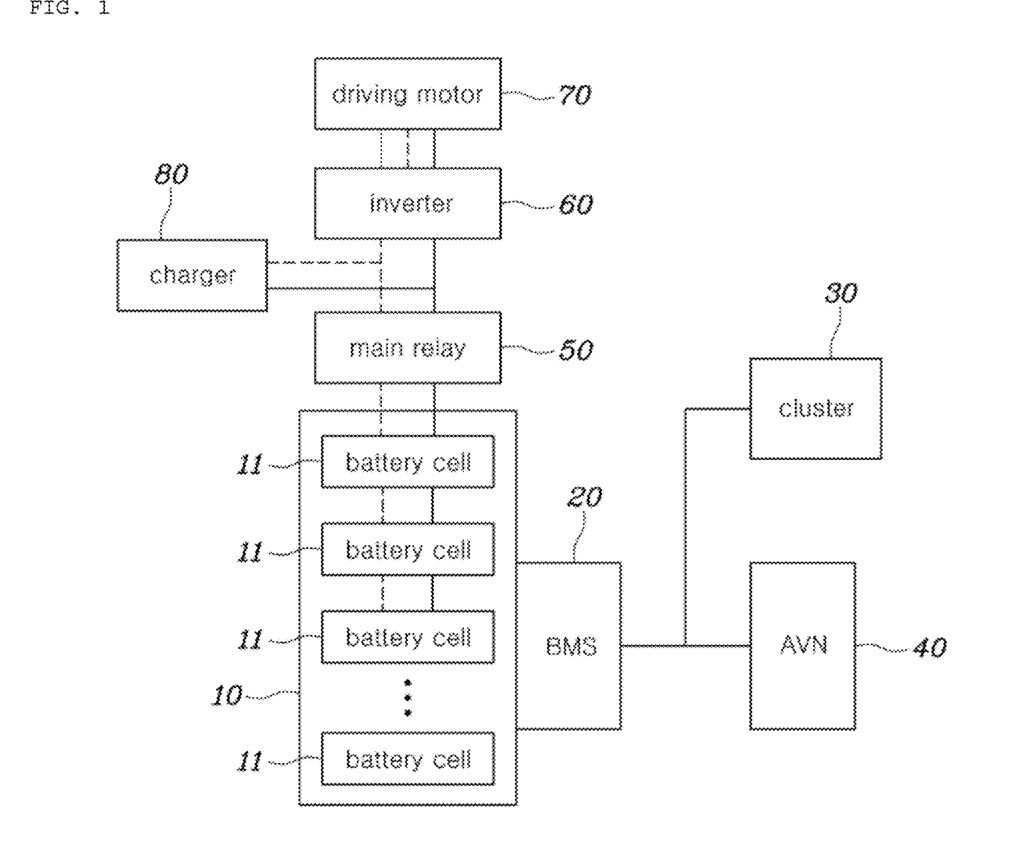
FIG. 1 is a block diagram of a system for managing a vehicle battery according to an embodiment of the present disclosure.

FIG. 1 is a block diagram of a system for managing a vehicle battery according to an embodiment of the present disclosure.

Referring to FIG. 1, a vehicle for managing a vehicle battery according to an embodiment of the present disclosure includes a battery 10 that has a plurality of battery cells 11 and stores energy to be provided to a driving motor 70 of a vehicle, and a battery management system (BMS) 20 corresponding to a controller that receives battery-related parameters including the voltage, current, temperature and insulation resistance of the battery 10, identifies a battery behavior based on the received parameters to determine an insulation state of the battery, and determines whether the battery is abnormal based on the determined insulation state.

The controller of the vehicle according to an exemplary embodiment of the present disclosure may be a processor (e.g., computer, microprocessor, CPU, ASIC, circuitry, logic circuits, etc.). The controller may be implemented by a non-transitory memory storing, e.g., a program(s), software instructions reproducing algorithms, etc., which, when executed, performs various functions described hereinafter, and a processor configured to execute the program(s), software instructions reproducing algorithms, etc. Herein, the memory and the processor may be implemented as separate semiconductor circuits. Alternatively, the memory and the processor may be implemented as a single integrated semiconductor circuit. The processor may embody one or more processor(s).

The battery 10 may be implemented in the form of a battery pack including a plurality of battery cells 11 that are connected to each other in a series-parallel to form an entire voltage of the battery. The plurality of battery cells 11 may form a unit voltage, and the entire voltage of the battery 10 may be determined by the number of the plurality of battery cells 11 and the series/parallel connection relationship.

Figure 2:
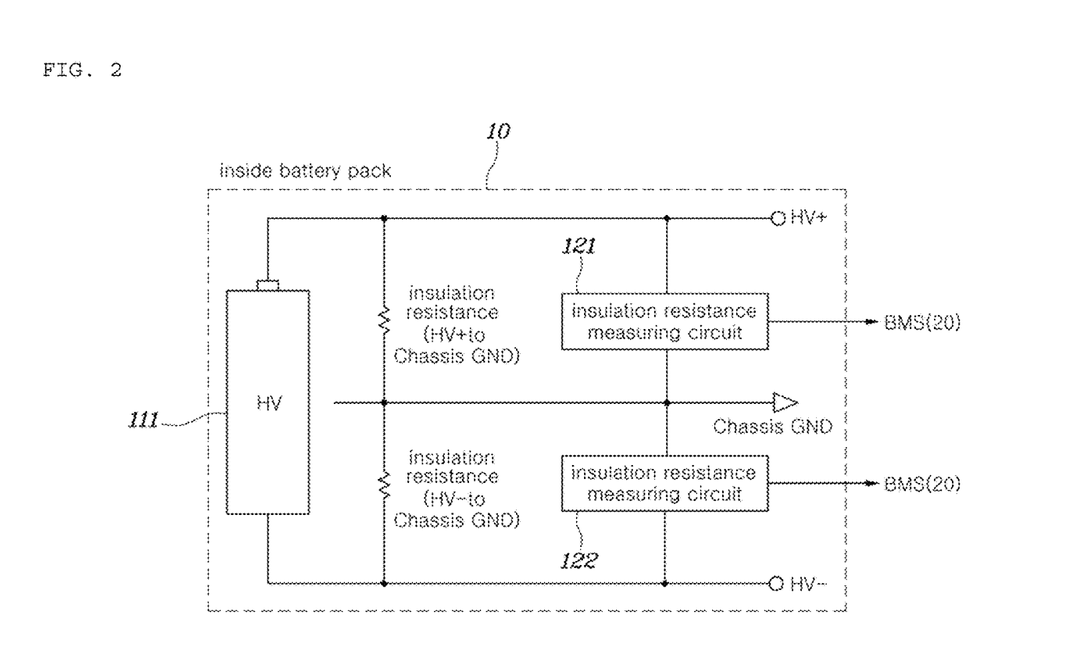
FIG. 2 is a view illustrating an example of an insulation resistance measuring circuit applied to a battery of a vehicle battery management system according to an embodiment of the present disclosure.

FIG. 2 is a view illustrating an example of an insulation resistance measuring circuit applied to a battery of a system for managing a vehicle battery according to an embodiment of the present disclosure.

As shown in FIG. 2, the inside of the battery 10 implemented in a form of a pack may be provided with a first insulation resistance measuring circuit 121 that measures an insulation resistance between a positive terminal (HV+) of the assembly 111 of battery cells connected in series and parallel to form a constant voltage and a chassis ground (Chassis GND) of the vehicle, and a second insulation resistance measuring circuit 122 that measures an insulation resistance between a negative terminal (HV−) of the assembly 111 of the battery cells and the chassis ground (Chassis GND) of the vehicle.

The insulation resistance value measured by each of the insulation resistance measuring circuits 121, 122 may be provided to the battery management system 20 which is a controller.

A detailed circuit configuration of each of the insulation resistance measuring circuits 121, 122 may be implemented using various topologies already known in the art. In various embodiments of the present disclosure, since it is a key feature to determine whether a vehicle battery is abnormal by using the measured insulation resistance, rather than measuring the insulation resistance, an additional description of measuring the insulation resistance will be omitted.

Ideally, the positive (HV+) terminal and negative (HV−) terminal of the battery 10 are insulated from the vehicle chassis ground (Chassis GND), respectively. However, in an actual vehicle environment, it is impossible to form a perfect insulation state between the battery 10 and the chassis ground of the vehicle due to various factors, and between the two, it has a high resistance value of a certain level or more that is almost close to an insulation state.

In other words, the electrical resistance between each terminal of the battery 10 and the vehicle chassis is referred to as an insulation resistance, and this insulation resistance is ideally infinite, but in an actual vehicle environment, it has a high resistance value of a certain level or more.

However, the insulation resistance of the battery 10 may decrease due to causes such as moisture penetration into the battery 10 or damage to the battery 10. When current leakage occurs due to a decrease in insulation resistance, serious problems such as fire due to overcurrent, etc. may occur not only while the vehicle is driving but also while the vehicle is parked.

The system and method for managing a vehicle battery according to an embodiment of the present disclosure monitors the insulation resistance of the vehicle battery 10 even in the parking state of the vehicle, and in particular, may perform more stringent battery monitoring by appropriately changing a reference value for monitoring the insulation resistance according to the behavior of the battery.

Such battery monitoring may be performed by the battery management system (BMS) 20 corresponding to a controller.

The battery management system 20 may receive the battery-related parameters such as voltage, current, temperature, and insulation resistance of the battery 10 and may determine whether abnormality occurs in the battery based on the input.

The battery management system 20 may wake up by receiving power at all times or by receiving power at a preset cycle so that it determines whether the battery 10 is abnormal even in a state in which the battery 10 is electrically disconnected to other electric filed loads of the vehicle, that is, in a parking state in which the vehicle's power is turned off (Ignition OFF).

A detailed technique of determining whether the abnormality of the battery occurs, which is performed by the battery management system 20, will be described later in more detail.

In addition, the system for managing a vehicle battery according to an embodiment of the present disclosure may include a cluster 30 or an audio video navigation (AVN) 40 that displays the occurrence of the abnormality to notify it to an external vehicle management server or a driver terminal, when it is determined that battery abnormality occurs in the battery management system 20.

In FIG. 1, the reference numeral '50' denotes a main relay that establishes or disconnects an electrical connection between the battery 10 and other components in the vehicle, and the reference numeral '60' denotes an inverter that converts the DC power stored in the battery 10 to the three-phase AC current used in the driving motor 70, and the reference numeral '80' denotes a charger that supplies charging power for charging the battery 10 to the battery.

The main relay 50 may be controlled to be in a short-circuit/open state by a controller (e.g., the battery management system 20 or another in-vehicle controller not shown).

When driving of the vehicle is required, the controller controls the main relay 50 to be in a short-circuit state so that the power stored in the battery 10 is provided to the inverter 60 so that power conversion is performed by the inverter 60, thereby generating a driving force in the driving motor 70. The driving motor 70 may be connected to a driving shaft of the vehicle to rotate the driving shaft to enable the vehicle for driving.

In addition, when charging of the battery 10 is required, the controller controls the main relay 50 to be in the short-circuit state so that the charging power provided from the charger 80 is applied to the battery 10 to charge the battery 10.

The charger 80 may be an on-board charger (OBC) that is installed in the vehicle and converts the AC power provided from an external charging facility into the DC power capable of charging the battery 10, or may be a charging facility itself outside the vehicle that provides a high DC charging current for fast charging.

In the description of the present disclosure, the parking state of the vehicle means a state in which the power of the vehicle is turned off after driving or charging of the vehicle is terminated, that is, a state in which the main relay 50 is opened. By opening the main relay 50, the battery 10 may be in a no-load state. However, as described above, even when the main relay 50 is open, the battery management system 20 is always turned on by power input or is turned on by receiving power periodically to monitor the insulation resistance of the battery and determine whether abnormality of the battery occurs based on the monitoring.

Figure 3:
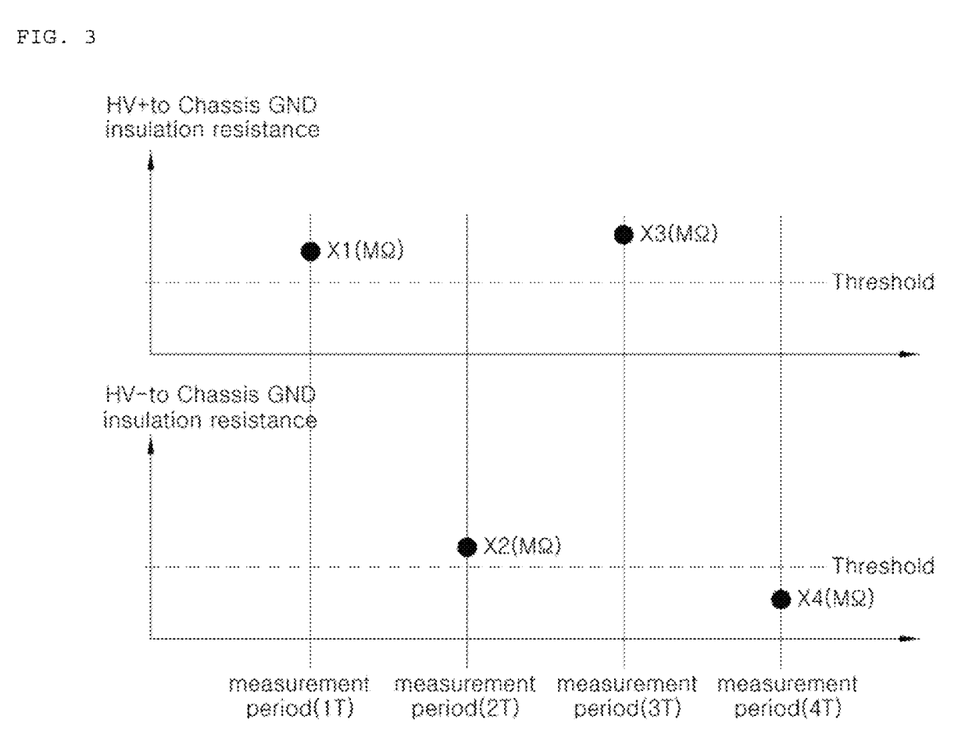
FIGS. 3, 4 and 5 are views for explaining various examples of an insulation resistance-based battery abnormality determination technique made in a battery management system according to an embodiment of the present disclosure.
Figure 4:
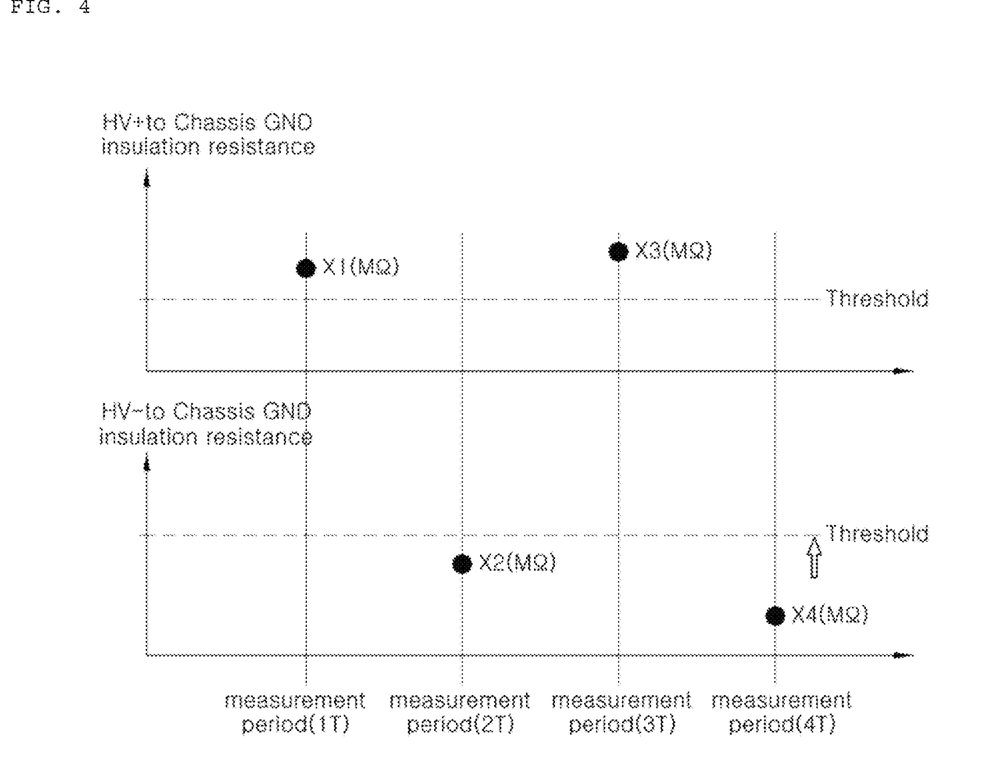
Figure 5:
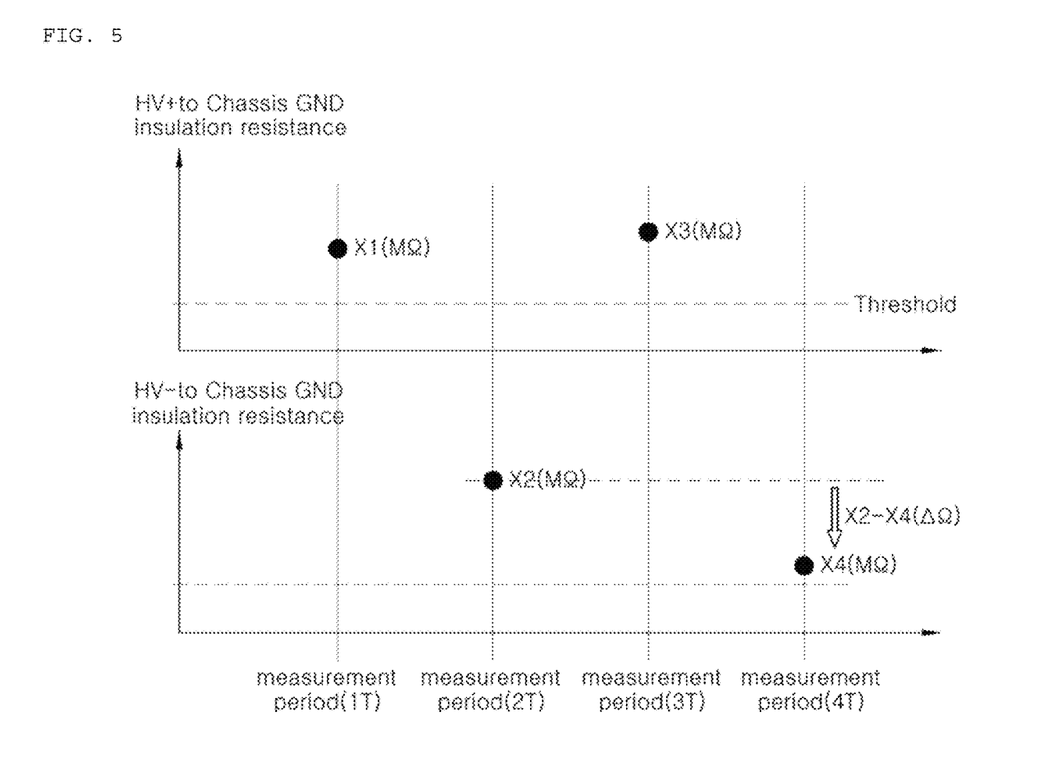

FIGS. 3 to 5 are views for explaining various examples of an insulation resistance-based battery abnormality determination technique made in a battery management system according to an embodiment of the present disclosure.

The controller (battery management system 20) may determine whether the battery 10 is abnormal based on the insulation resistance of the battery 10. Most basically, as shown in FIG. 3, the controller can determine that a problem occurs in the insulation resistance of the battery when a measured insulation resistance value is smaller than a preset reference value for determining the insulation resistance abnormality.

In the system and method for managing a vehicle battery according to an embodiment of the present disclosure, a controller (battery management system 20) may collect the battery-related parameters such as voltages of the battery cells 11 and temperature of the battery 10, and may change and apply the reference value compared with the insulation resistance based on the collected parameters.

For example, the controller may decrease and apply the reference value as the voltage deviation between the plurality of battery cells 11 included in the battery 10 increases. Here, the voltage deviation may be a difference between a maximum value and a minimum value among voltages of the plurality of battery cells 11.

In general, since the battery 10 is manufactured to include the plurality of battery cells 11 having the same specification, ideally the voltages of all the battery cells 11 should be the same. However, the voltages of the plurality of battery cells 11 may have deviations due to errors in the manufacturing process of the battery cells 11, and in the case of a normal battery, the voltages of the battery cells should be maintained within a preset allowable deviation.

If abnormality occurs in some battery cells due to external environmental factors or manufacturing defects of the battery cells themselves, the corresponding battery cells may have higher or lower voltages outside a certain range compared to the rest of the normal battery cells. That is, the voltage deviation between the battery cells becomes a parameter that can infer the occurrence of abnormality in the battery cells, and when the voltage deviation between the battery cells becomes greater than a certain level, the probability of inferring that abnormality occurs in the battery cells increases, so that it is possible to more strictly determine the occurrence of abnormality by decreasing and using the insulation resistance value compared with the insulation resistance.

As another example, the controller may decrease and apply the reference value as the temperature of the battery 10 increases.

Similar to the voltage deviation between the battery cells 11, more heat may be generated in the battery cells 11 in which abnormality occurs compared to other battery cells 11. Accordingly, the increase in the temperature of the battery 10 means that the probability that abnormality occurs in the battery itself is higher. Accordingly, in various embodiments of the present disclosure, when the voltage of the battery increases by more than a certain level, the abnormality occurrence determination can be made more strictly by further decreasing and using the reference value compared with the insulation resistance.

The voltages and temperatures of the battery cells may be achieved by a voltage sensor that detects a voltage in a battery cell or a battery module unit including the battery cells, and a temperature sensor and the like installed at an arbitrary position inside the battery pack. Since the means for detecting the voltages of the battery cells and the battery temperature are very obvious to those skilled in the art, a detailed description thereof will be omitted.

The controller may include a data map for a reference value that is changed according to the battery cell voltage deviation and the battery temperature. An example of such a data map is shown in Table 1 below.

As shown in Table 1 above, when the battery cell voltage deviation is greater than a smallest reference value A1 and less than or equal to a next largest reference value A2, the insulation resistance abnormality may be determined using a smallest reference value C1. However, when the cell voltage deviation is greater than the reference value A2 and less than or equal to a reference value A3, the insulation resistance abnormality may be determined using a reference value C2 greater than the reference value C1.

As shown in FIG. 4, when the cell voltage deviation increases and the magnitude of the reference value compared with the insulation resistance increases, the insulation resistance determined to be normal in the measurement period 2T of FIG. 3 may be determined to be abnormal. That is, when it is determined by using the cell voltage deviation that the possibility of abnormality occurrence is higher, the problem or accident occurring in the battery itself can be more safely prevented in advance by determining the insulation resistance abnormality based on a more stringent standard.

Like the battery cell voltage deviation, the battery temperature also increases as the battery temperature becomes larger than the larger reference value, and thus the reference value for determining the insulation resistance abnormality increases, thereby enabling more stringent abnormality determination.

The condition for the battery cell voltage deviation and the change in the magnitude of the reference value for comparing with the insulation resistance based on the battery temperature may be applied when both conditions are simultaneously satisfied or when only one of the two conditions is satisfied.

On the other hand, the system and method for managing a vehicle battery according to an embodiment of the present disclosure may determine whether abnormality occurs according to a change in magnitude of the insulation resistance that is periodically measured, together with comparing the magnitude of the insulation resistance itself with the reference value.

For example, as shown in FIG. 5, when the insulation resistance measured in the measurement period T4 is lower than the insulation resistance measured in the measurement period T2 before the measurement period T4, and the magnitude of the decreased insulation resistance is higher than the preset reference value, it may be determined that abnormality occurs in the battery.

This determination method of the battery insulation resistance abnormality detects in advance an abnormal battery event that abruptly occurs in the parking state of the vehicle, so that a more rapid and efficient response can be performed.

TABLE 1

|  | 1st failure determination step | 2nd failure determination step | 3rd failure determination step | 4th failure determination step |
| --- | --- | --- | --- | --- |
| cell voltage deviation | >A1 mV | >A2 mV | >A3 mV | >A4 mV |
| temperature | >B1 mV | >B2 mV | >B3 mV | >B4 mV |
| insulation breakdown reference value | <C1 kΩ | <C2 kΩ | <C3 kΩ | <C4 kΩ |

In Table 1 above, A1<A2<A3<A4, B1<B2<B3<B4, C1<C2<C3<C4, and they are all positive numbers.

The reference value compared with the decrease amount of the insulation resistance may also be changed according to the battery cell voltage deviation or battery temperature as described above. An example of such a reference value change is shown in Table 2 below.

TABLE 2

|  | 1st failure determination step | 2nd failure determination step | 3rd failure determination step | 4th failure determination step |
|---|---|---|---|---|
| cell voltage deviation | >A1 mV | >A2 mV | >A3 mV | >A4 mV |
| temperature | >B1 mV | >B2 mV | >B3 mV | >B4 mV |
| insulation breakdown reference value | >ΔC1 kΩ | <ΔC2 kΩ | <ΔC3 kΩ | <ΔC4 kΩ |

As shown in Table 1, in Table 2 above, A1<A2<A3<A4 and B1<B2<B3<B4. In order to more strictly determine the occurrence of abnormality in the battery, it should be possible to determine the occurrence of abnormality even with a small change in insulation resistance, so C1>C2>C3>C4, and they are all positive.

That is, as the battery cell voltage deviation increases and the battery temperature increases, the magnitude of the reference value compared with the decrease amount of the insulation resistance measurement value per measurement period may decrease.

In Table 1 and Table 2 above, there are a total of four reference values compared with the insulation resistance and the decrease amount of the insulation resistance, but this is only an example. The number of reference values may be increased for more detailed determination, and the number of reference values may be decreased to exclude excessively sensitive determination.

Figure 6:
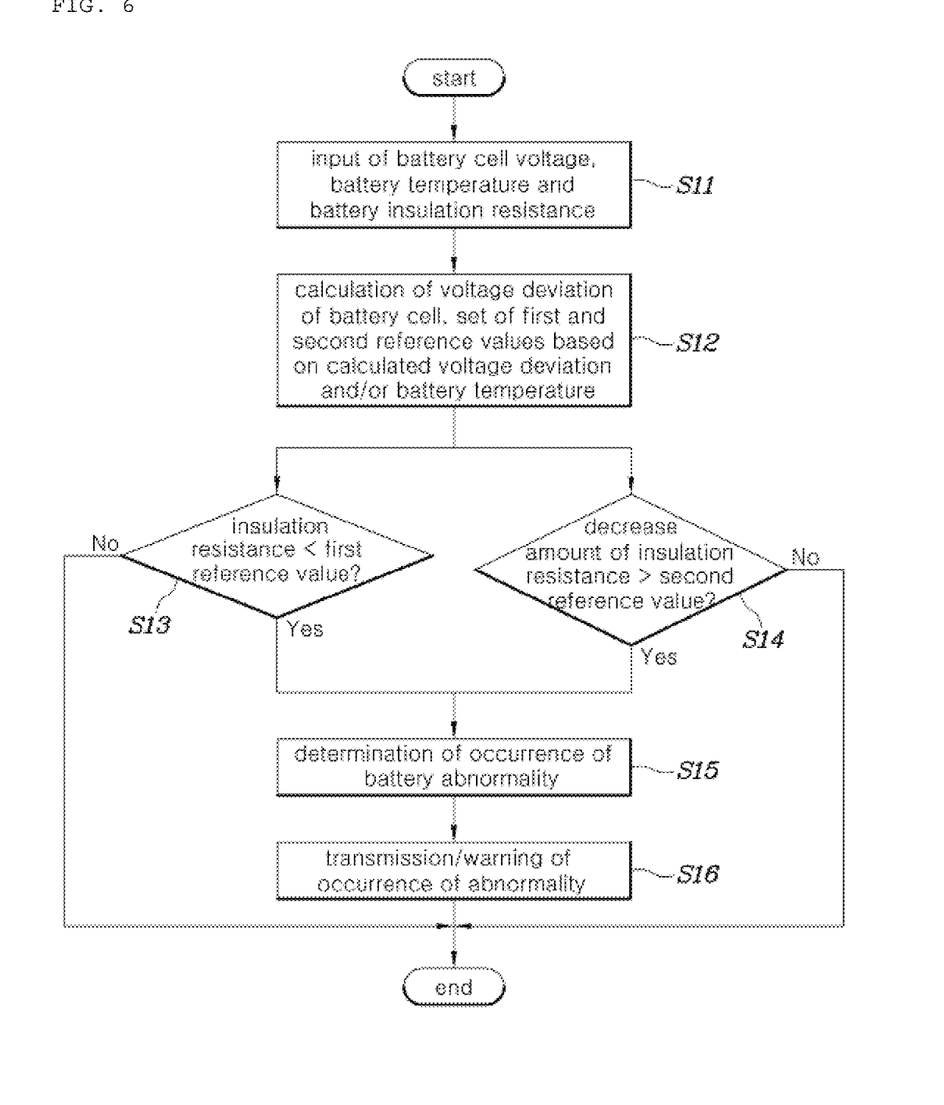
FIG. 6 is a flowchart illustrating a method for managing a vehicle battery according to an embodiment of the present disclosure.

FIG. 6 is a flowchart illustrating a method for managing a vehicle battery according to an embodiment of the present disclosure.

Referring to FIG. 6, the method for managing a vehicle battery according to an embodiment of the present disclosure may start from the step (S11) in which the controller (battery management system 20) receives the voltages of the battery cells 11, the temperature of the battery 10, and the insulation resistance of the battery 10.

The step (S11) may be performed at every preset cycle, and in particular, in the parking state in which the main relay connected to the battery 10 of the vehicle is off, the controller may receive the voltages of the battery cells 11, the temperature of the battery 10, and the insulation resistance of the battery 10 at every preset cycle and may perform the battery abnormality determination based on the insulation resistance.

Next, the controller may calculate the voltage deviation of the battery cells and may determine the reference values based on the calculated voltage deviation of the battery cells and the battery temperature (S12).

In the step (S12), the controller may calculate the voltage deviation of the battery cells by subtracting a minimum value from a maximum value among the received voltages of the plurality of battery cells 11. In addition, by using the data map for determining the reference value as in Tables 1 and 2 described above, a first reference value compared with the magnitude of the measured insulation resistance and a second reference value compared with a decrease amount of the insulation resistance may be determined.

Next, the controller may compare the magnitude of the insulation resistance with the first reference value and compare the decrease amount of the insulation resistance with the second reference value (S13, S14). If the insulation resistance is not decreased, the step (S14) may not be performed.

When the magnitude of the insulation resistance itself is smaller than the first reference value, the possibility of insulation breakdown is high, and thus it may be determined that abnormality occurs in the battery (S15). In addition, even when the decrease amount of the insulation resistance compared to the insulation resistance measured immediately before according to the measurement period is greater than the second reference value, it is highly likely that the insulation breakdown is in progress, so it can be determined that abnormality occurs in the battery (S15).

Then, the controller may transmit the occurrence of insulation resistance-related abnormality of the battery 10 to a cluster 30 or AVN 40 of the vehicle to display the occurrence of battery insulation resistance abnormality on the cluster 30 or the AVN 40 (S16). When a wireless communication module is provided in the cluster 30 or the AVN 40, the cluster 30 or AVN 40 may notify that abnormality occurs in the battery insulation resistance through the wireless communication module to a remote vehicle management server or a wireless terminal of a preregistered driver.

As described above, the system and method for managing a vehicle battery according to various embodiments of the present disclosure may determine whether the battery is abnormal based on the insulation resistance of the vehicle battery.

In particular, the system and method for managing a vehicle battery according to various embodiments of the present disclosure may perform the insulation resistance abnormality determination more strictly by changing the reference value for determining the insulation resistance abnormality by using other parameters indicating signs of battery abnormality such as battery cell voltage deviation or battery temperature.

In addition, the system and method for managing a vehicle battery according to various embodiments of the present disclosure determine the battery insulation resistance abnormality based on the decrease amount of the battery insulation resistance, so that when the battery insulation breakdown is in progress in the parking state, the battery abnormality is quickly detected in advance and is warned. Thus, it is possible to prevent the occurrence of more serious problems such as battery fire.

Although specific embodiments of the present disclosure have been illustrated and described above, it will be apparent to those skilled in the art that the present disclosure can be variously improved and changed within the scope of the claims.

| DESCRIPTION OF REFERENCE NUMERALS | |
| --- | --- |
| 10: battery | 11: battery cell |
| 20: battery management system (BMS) | |
| 30: cluster | |
| 40: AVN | 50: main relay |
| 60: inverter | 70: driving motor |
| 80: charger | |

What is claimed is:

1. A system for managing a vehicle battery that is chargeable/dischargeable and stores energy for driving a vehicle driving motor, the system comprising:
a controller configured to:
receive a voltage of each of a plurality of battery cells in the vehicle battery, a temperature of the vehicle battery, and an insulation resistance of the vehicle battery,
determine a reference value based on a deviation between voltages of the plurality of battery cells and the temperature of the vehicle battery, and
determine whether the vehicle battery is abnormal by comparing the reference value with the insulation resistance,
wherein the insulation resistance is a variable value and a measurable value, and
wherein the reference value is changed according to the deviation between the voltages of the plurality of battery cells and the temperature of the vehicle battery.

2. The system for managing the vehicle battery according to claim 1, wherein the controller determines a difference between a maximum value and a minimum value among the voltages of the plurality of battery cells as the deviation.

3. The system for managing the vehicle battery according to claim 1, wherein the controller determines that abnormality occurs in the vehicle battery when a magnitude of the received insulation resistance is smaller than the reference value.

4. The system for managing the vehicle battery according to claim 3, wherein the controller decreases a magnitude of the reference value as the deviation increases.

5. The system for managing the vehicle battery according to claim 3, wherein the controller decreases a magnitude of the reference value as the temperature increases.

6. The system for managing the vehicle battery according to claim 1, wherein the controller determines whether the vehicle battery is abnormal at every preset period, and determines that abnormality occurs in the vehicle battery when a decrease amount of the insulation resistance obtained by subtracting a magnitude of the insulation resistance currently received from a magnitude of the insulation resistance received immediately before according to the present period is greater than the reference value.

7. The system for managing the vehicle battery according to claim 6, wherein the controller decreases a magnitude of the reference value as the deviation increases.

8. The system for managing the vehicle battery according to claim 6, wherein the controller decreases a magnitude of the reference value as the temperature increases.

9. The system for managing the vehicle battery according to claim 1, further comprising a cluster or an audio video navigation (AVN) that displays occurrence of abnormality in the vehicle battery when the controller determines that the abnormality occurs in the vehicle battery.

10. The system for managing the vehicle battery according to claim 9, wherein the cluster or the AVN includes a communication module that wirelessly transmits the occurrence of abnormality in the vehicle battery to a vehicle management server or a wireless terminal of a driver of a vehicle.

11. A method for managing a vehicle battery that is chargeable/dischargeable and stores energy for driving a vehicle driving motor, the method comprising steps of:
receiving a voltage of each of a plurality of battery cells in the vehicle battery, a temperature of the vehicle battery, and an insulation resistance of the vehicle battery;
determining a reference value based on a deviation between voltages of the plurality of battery cells and a temperature of the vehicle battery; and
determining whether the vehicle battery is abnormal by comparing the determined reference value with the insulation resistance,
wherein the insulation resistance is a variable value and a measurable value, and
wherein the reference value is changed according to the deviation between the voltages of the plurality of battery cells and the temperature of the vehicle battery.

12. The method for managing the vehicle battery according to claim 11, wherein in the step of determining the reference value, a difference between a maximum value and a minimum value among the voltages of the plurality of battery cells is determined as the deviation.

13. The method for managing the vehicle battery according to claim 11, wherein in the step of determining whether the vehicle battery is abnormal, it is determined that abnormality occurs in the vehicle battery when a magnitude of the received insulation resistance is smaller than the reference value.

14. The method for managing the vehicle battery according to claim 13, wherein in the step of determining the reference value, a magnitude of the reference value decreases as the deviation increases.

15. The method for managing the vehicle battery according to claim 13, wherein in the step of determining the reference value, a magnitude of the reference value decreases as the temperature increases.

16. The method for managing the vehicle battery according to claim 11, wherein the step of receiving, the step of determining the reference value and the step of determining whether the vehicle battery is abnormal are repeated every preset period, and in the step of determining whether the vehicle battery is abnormal, it is determined that abnormality occurs in the vehicle battery when a decrease amount of the insulation resistance obtained by subtracting a magnitude of the insulation resistance currently received from a magnitude of the insulation resistance received immediately before according to the present period is greater than the reference value.

17. The method for managing the vehicle battery according to claim 16, wherein in the step of determining the reference value, a magnitude of the reference value decreases as the deviation increases.

18. The method for managing the vehicle battery according to claim 16, wherein the step of determining the reference value, a magnitude of the reference value decreases as the temperature increases.

19. The method for managing the vehicle battery according to claim 11, further comprising a step of displaying occurrence of abnormality in the vehicle battery on a cluster or an audio video navigation (AVN) when in the step of determining whether the vehicle battery is abnormal, it is determined that the abnormality occurs in the vehicle battery.

20. The method for managing the vehicle battery according to claim 19, wherein the step of displaying includes a step of wirelessly transmitting the occurrence of abnormality in the vehicle battery to a vehicle management server or a wireless terminal of a driver of a vehicle.

* * * * *